United States Patent
Bunn et al.

(10) Patent No.: US 7,275,115 B2
(45) Date of Patent: Sep. 25, 2007

(54) CABLE MODEM SYSTEM AND METHOD FOR SUPPORTING PACKET PDU COMPRESSION

(75) Inventors: Fred A Bunn, Roswell, GA (US); Thomas L Johnson, Gainesville, GA (US)

(73) Assignee: Broadcom Corporation, Irvine, CA (US)

( * ) Notice: Subject to any disclaimer, the term of this patent is extended or adjusted under 35 U.S.C. 154(b) by 835 days.

(21) Appl. No.: 09/973,783

(22) Filed: Oct. 11, 2001

(65) Prior Publication Data

US 2002/0049861 A1 Apr. 25, 2002

Related U.S. Application Data

(60) Provisional application No. 60/240,550, filed on Oct. 13, 2000, provisional application No. 60/239,525, filed on Oct. 11, 2000, provisional application No. 60/239,526, filed on Oct. 11, 2000, provisional application No. 60/239,524, filed on Oct. 11, 2000, provisional application No. 60/239,530, filed on Oct. 11, 2000, provisional application No. 60/239,527, filed on Oct. 11, 2000.

(51) Int. Cl.
*G06F 15/173* (2006.01)
*H03M 7/34* (2006.01)
*H04B 1/66* (2006.01)

(52) U.S. Cl. .................. 709/247; 709/246; 341/51; 375/240

(58) Field of Classification Search ............. 709/246, 709/247; 341/51; 375/240
See application file for complete search history.

(56) References Cited

U.S. PATENT DOCUMENTS

| | | | | |
|---|---|---|---|---|
| 5,293,379 A | * | 3/1994 | Carr | .................... 370/474 |
| 5,307,413 A | | 4/1994 | Denzer | |
| 5,530,645 A | * | 6/1996 | Chu | ..................... 715/532 |

(Continued)

FOREIGN PATENT DOCUMENTS

| | | |
|---|---|---|
| WO | 0 806 852 A2 | 11/1997 |
| WO | 0 933 876 A1 | 8/1999 |

OTHER PUBLICATIONS

"Radio Frequency Interface Specification SP-RFIv1.1-I05-000714," Data-Over-Cable Service Interface Specifications, Jul. 14, 2000, retrieved from the Internet on May 20, 2002:<URL:http://www.docsis.org/docs/SP-RFIv1.1-I05-000714.pdf>, pp. i-xviii, 1-6, 15-21, 93-100, 143-178.

(Continued)

*Primary Examiner*—Nathan Flynn
*Assistant Examiner*—Joshua Joo
(74) *Attorney, Agent, or Firm*—Sterne, Kessler, Goldstein & Fox, P.L.L.C.

(57) ABSTRACT

A cable modem system and method are provided for using a data compression dictionary to transmit compressed payload data in a DOCSIS network while utilizing conventional cable modem termination system (CMTS) equipment. A cable modem system in accordance with the invention includes a cable modem and a CMTS adapted to send and receive compressed payload data. In one example, the cable modem is adapted to compress PDU payload data using a data compression dictionary and the CMTS is adapted to reconstruct the compressed PDU payload data that is received from the cable modem.

11 Claims, 7 Drawing Sheets

U.S. PATENT DOCUMENTS

| | | | |
|---|---|---|---|
| 5,537,551 A * | 7/1996 | Denenberg et al. | 709/247 |
| 5,646,617 A * | 7/1997 | Ohmoto et al. | 341/51 |
| 5,737,733 A * | 4/1998 | Eller | 707/3 |
| 5,831,558 A | 11/1998 | Harvell | 341/106 |
| 5,945,933 A * | 8/1999 | Kalkstein | 341/63 |
| 5,987,022 A | 11/1999 | Geiger et al. | |
| 6,032,197 A | 2/2000 | Birdwell et al. | 709/247 |
| 6,078,955 A * | 6/2000 | Konno et al. | 709/224 |
| 6,181,716 B1 | 1/2001 | Lide | |
| 6,195,391 B1 | 2/2001 | Hancock et al. | |
| 6,198,735 B1 | 3/2001 | Pazhyannur et al. | |
| 6,295,481 B1 | 9/2001 | Price | |
| 6,300,887 B1 | 10/2001 | Le | |
| 6,434,168 B1 | 8/2002 | Kari | |
| 6,438,123 B1 * | 8/2002 | Chapman | 370/351 |
| 6,529,912 B2 | 3/2003 | Satoh et al. | |
| 6,535,925 B1 | 3/2003 | Svanbro et al. | |
| 6,542,504 B1 | 4/2003 | Mahler et al. | |
| 6,542,931 B1 | 4/2003 | Le et al. | |
| 6,594,280 B1 | 7/2003 | Chapman | |
| 6,597,812 B1 * | 7/2003 | Fallon et al. | 382/232 |
| 6,765,925 B1 | 7/2004 | Sawyer et al. | |
| 6,788,707 B1 | 9/2004 | Horton, Jr. et al. | |
| 6,882,637 B1 | 4/2005 | Le et al. | |
| 6,889,385 B1 * | 5/2005 | Rakib et al. | 725/119 |
| 6,901,049 B1 | 5/2005 | Chapman | |
| 6,909,715 B1 | 6/2005 | Denney et al. | |
| 6,963,587 B2 * | 11/2005 | Hannu et al. | 370/477 |
| 2001/0004768 A1 | 6/2001 | Hodge et al. | |
| 2002/0029206 A1 * | 3/2002 | Satoh et al. | 707/1 |
| 2002/0049861 A1 | 4/2002 | Bunn et al. | |
| 2002/0073227 A1 | 6/2002 | Bunn et al. | |
| 2002/0080868 A1 | 6/2002 | Bunn et al. | |
| 2002/0191691 A1 | 12/2002 | Holborow | |
| 2003/0185245 A1 | 10/2003 | Kang et al. | |
| 2005/0030944 A1 | 2/2005 | Lazarus et al. | |
| 2005/0169364 A1 * | 8/2005 | Singh | 375/240 |

OTHER PUBLICATIONS

"Transparent Automoding Procedure between a Local (Client) Modem and a Remote (Server) Modem," *Research Disclosure*, Kenneth Mason Publications, Aug. 1999, pp. 1138-1139.

International Search Report issued Apr. 12, 2002 for Appln. No. PCT/US01/31554, 7 pages.

Perkins, S.J. and Mutka, M.W., "Dependency Removal for Transport Protocol Header Compression over Noisy Channels," *IEEE*, 1997, pp. 1025-1029.

Jacobson, V., "Compressing TCP/IP Headers," RFC 1144, *Network Working Group*, Feb. 1990, pp. 1-43.

International Search Report issued Apr. 4, 2002 for Appln. No. PCT/US01/31556, 7 pages.

Salomon, D., *Data Compression: The Complete Reference*, Springer, US, New York, NY, 1998, pp. 101-162 and 357-360.

International Search Report issued Apr. 4, 2002 for Appln. No. PCT/US01/31553, 7 pages.

Casner, S. et al., "Compressing IP/UDP/RTP Headers for Low-Speed Serial Links," Network Working Group, Feb. 1999, pp. 1-23.

International Search Report issued Apr. 12, 2002 for Appln. No. PCT/US01/31559, 6 pages.

International Search Report issued Apr. 12, 2002 for Appln. No. PCT/US01/31567, 6 pages.

International Preliminary Examination Report for PCT/US01/31559, dated Nov. 25, 2002, (4 pages).

Jacobson, V., "Compressing TCP/TP Headers For Low-Speed Serial Links", RFC 1144, Feb. 1990.

* cited by examiner

| PDU Payload Data String | Token |
|---|---|
| http://www | 01 |
| POP | 10 |
| SMTP | 011 |
| GET | 110 |
| PUT | 111 |
| | |

405 (left brace) 410 (right brace)

FIG. 4

CABLE MODEM SYSTEM AND METHOD FOR SUPPORTING PACKET PDU COMPRESSION

CROSS-REFERENCE TO RELATED APPLICATIONS

This application claims priority to the following provisional applications:

Provisional U.S. Patent Application Ser. No. 60/239,525, entitled "Using the TDMA Characteristics of a DOCSIS Cable Modem Network to Support Extended Protocols," filed Oct. 11, 2000, by Bunn et al., (incorporated by reference in its entirety herein).

Provisional U.S. Patent Application Ser. No. 60/239,526, entitled "Dynamic Delta Encoding for Cable Modem Header Suppression," filed Oct. 11, 2000 by Bunn et al., (incorporated by reference in its entirety herein).

Provisional U.S. Patent Application Ser. No. 60/239,524, entitled "Dynamically Mixing Protocol-Specific Header Suppression Techniques to Maximize Bandwidth Utilization in a DOCSIS Network," filed Oct. 11, 2000 by Bunn et al., (incorporated by reference in its entirety herein).

Provisional U.S. Patent Application Ser. No. 60/239,530, entitled "Efficiently Transmitting RTP Protocol in a Network that Guarantees In Order Delivery of Packets," filed Oct. 11, 2000 by Bunn et al., (incorporated by reference in its entirety herein).

Provisional U.S. Patent Application Ser. No. 60/239,527, entitled "Packet PDU Data Compression within a DOCSIS Network," filed Oct. 11, 2000, by Bunn et al., (incorporated by reference in its entirety herein).

Provisional U.S. Patent Application Ser. No. 60/240,550, entitled "Cable Modem System," filed Oct. 13, 2000, by Bunn et al., (incorporated by reference in its entirety herein).

This application is related to the following non-provisional applications, all having the same filing date as the present application:

"Cable Modem System and Method For Dynamically Mixing Protocol-Supporting Extended Protocols," U.S. patent Ser. No. 09/973,875, by Bunn et al. filed concurrently herewith and incorporated by reference herein in its entirety.

"Dynamic Delta Encoding for Cable Modem Header Suppression," U.S. patent Ser. No. 09/973,871, by Bunn et al., filed concurrently herewith and incorporated by reference herein in its entirety.

"Cable Modem System and Method for Dynamically Mixing Protocol-Specific Header Suppression Techniques," U.S. patent Ser. No. 09/973,781, by Bunn et al., filed concurrently herewith and incorporated by reference herein in its entirety.

"Efficiently Transmitting RTP Protocol in a Network that Guarantees In Order Delivery of Packets," U.S. patent Ser. No. 09/973,872, by Bunn et al., filed concurrently herewith and incorporated by reference herein in its entirety.

BACKGROUND OF THE INVENTION

1. Field of the Invention

The present invention is generally related to communication systems. More particularly, the present invention is related to cable modem systems and methods for transferring data between a cable modem system and a cable modem termination system.

2. Background

In conventional cable modem systems, a hybrid fiber-coaxial (HFC) network provides a point-to-multipoint topology for supporting data communication between a cable modem termination system (CMTS) at the cable headend and multiple cable modems (CM) at the customer premises. In such systems, information is broadcast downstream from the CMTS to the cable modems as a continuous transmitted signal in accordance with a time division multiplexing (TDM) technique. In contrast, information is transmitted upstream from each of the cable modems to the CMTS as short burst signals in accordance with a time domain multiple access (TDMA) technique. The upstream transmission of data from the cable modems is managed by the CMTS, which allots to each cable modem specific slots of time within which to transfer data.

Conventional cable modem systems are asymmetrical in that there is considerably less bandwidth available for upstream transmissions than there is for downstream transmissions. This lack of upstream bandwidth is further exacerbated by the fact that the upstream channels must be shared by multiple cable modems. As a result, the conservation of upstream bandwidth is imperative in order to maintain overall system performance. This is particularly true where cable modem users are engaging in activities that require both substantial upstream and downstream bandwidth, such as IP telephony, video teleconferencing and Internet gaming.

Conventional cable modem systems utilize DOCSIS-compliant equipment and protocols to carry out the transfer of Protocol Data Units (PDU) data packets between multiple cable modems and a CMTS. PDU data packets are comprised of a header portion and a payload portion. The payload portion is the information intended to be transmitted from one point to another, for example, voice or data. The header portion contains protocol information identifying the source and destination of the payload. The header portion of the PDU data packet further provides instructions on how to process the payload portion contained therein. The term DOCSIS (Data Over Cable System Interface Specification) generally refers to a group of specifications published by CableLabs that define industry standards for cable headend and cable modem equipment. In part, DOCSIS sets forth requirements and objectives for various aspects of cable modem systems including operations support systems, management, data interfaces, as well as network layer, data link layer, and physical layer transport for data over cable systems. The most current version of the DOCSIS specification is DOCSIS 1.1.

It has been observed, however, that the use of proprietary data transfer protocols that extend beyond those provided by the DOCSIS specification may be advantageous in conserving network bandwidth in a cable modem system. This is particularly true with respect to Payload Header Suppression (PHS). PHS, as defined by DOCSIS 1.1, allows for the suppression of unnecessary Ethernet/IP header information in the header portion of a DOCSIS packet by the cable modem and subsequent reconstruction of the header portion by the CMTS. The goal of PHS is to reduce the number of bits transferred per packet, thereby improving network bandwidth utilization. However, DOCSIS PHS only permits header suppression based on the presence of redundant header bytes in sequentially-transmitted packets. The above referenced patent applications disclose ways to utilize more efficient payload header suppression techniques in transferring data over a cable modem network. However, it is has been further observed that the DOCSIS protocol does not support data compression in the payload portion of the PDU data packets. Many packets normally transmitted in the upstream direction in a DOCSIS network contain identical ASCII character strings in the payload. Examples of these strings are "http://www.", "POP", "SMTP", "GET", and "PUT". The network could be used more efficiently if the payload of a given DOCSIS packet could be transmitted with fewer bytes.

Heretofore, the use of proprietary data transfer protocols that extend beyond those provided by the DOCSIS specification have been avoided. This is due, in part, to the fact that the DOCSIS specification does not provide a mechanism for using alternative protocols in a cable modem system. For example, the DOCSIS specification does not provide a mechanism for the use of data packet formats other than those it provides. Moreover, because conventional CMTS and cable modem devices have been designed in accordance with the DOCSIS specification, the use of extended protocols has been avoided to ensure interoperability between individual cable modem system components. For example, conventional DOCSIS-compliant CMTS equipment is incapable of differentiating between standard DOCSIS traffic and traffic transmitted in accordance with an extended protocol.

Accordingly, what is desired is a system and method for transferring data in a cable modem network that supports the use of protocols that extend beyond the DOCSIS specification. More particularly, the desired system and method should support the use of PDU payload data compression. However, the desired system and method should be interoperable with DOCSIS in the sense that components of a cable modem system that support PDU payload compression can exist on the same network with components that do not. Furthermore, the desired system and method should require very little modification to existing cable modem system components, such as existing cable modem and CMTS equipment.

BRIEF SUMMARY OF THE INVENTION

The present invention is directed to a cable modem system that allows for use of proprietary data transfer protocols that extend beyond those provided by the DOCSIS specification. More particularly, the present invention provides a system and method for compressing PDU payload data transmitted within a DOCSIS service identifier (SID). The CMTS identifies a plurality of frequently occurring data strings within the PDU payload transmitted by cable modems in the DOCSIS network. The CMTS then assigns a token to represent each one of the plurality of frequently occurring data strings. Each one of the plurality of frequently occurring data strings and each token assigned to represent each one of the plurality of frequently occurring data strings are then entered into a lookup table of a data compression dictionary. The data compression dictionary is then transmitted to all cable modems in the DOCSIS network.

Upon receiving a plurality of PDU data packets for transmission, a cable modem searches the data compression dictionary for the data strings contained in the payload portion of each PDU data packet. For each data string stored in the data compression dictionary, the cable modem replaces the data string with the token assigned to represent the data string within the PDU payload. Next, the cable modem appends a compression indicator to each token. The compression indicator signals the cable modem termination system to look up the token in its data compression dictionary. The cable modem then transmits to a cable modem termination system, the plurality of data packets that now contain the tokens as their PDU payload. The cable modem termination system identifies the token representing the compressed PDU payload data string. The CMTS then searches its data compression dictionary for the token to identify the corresponding expanded data string. The CMTS then replaces the token with the corresponding expanded data string. In this way each data packet is restored to its original form.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 4 is a block diagram of a data compression dictionary in accordance with embodiments of the present invention.

Figure 1:
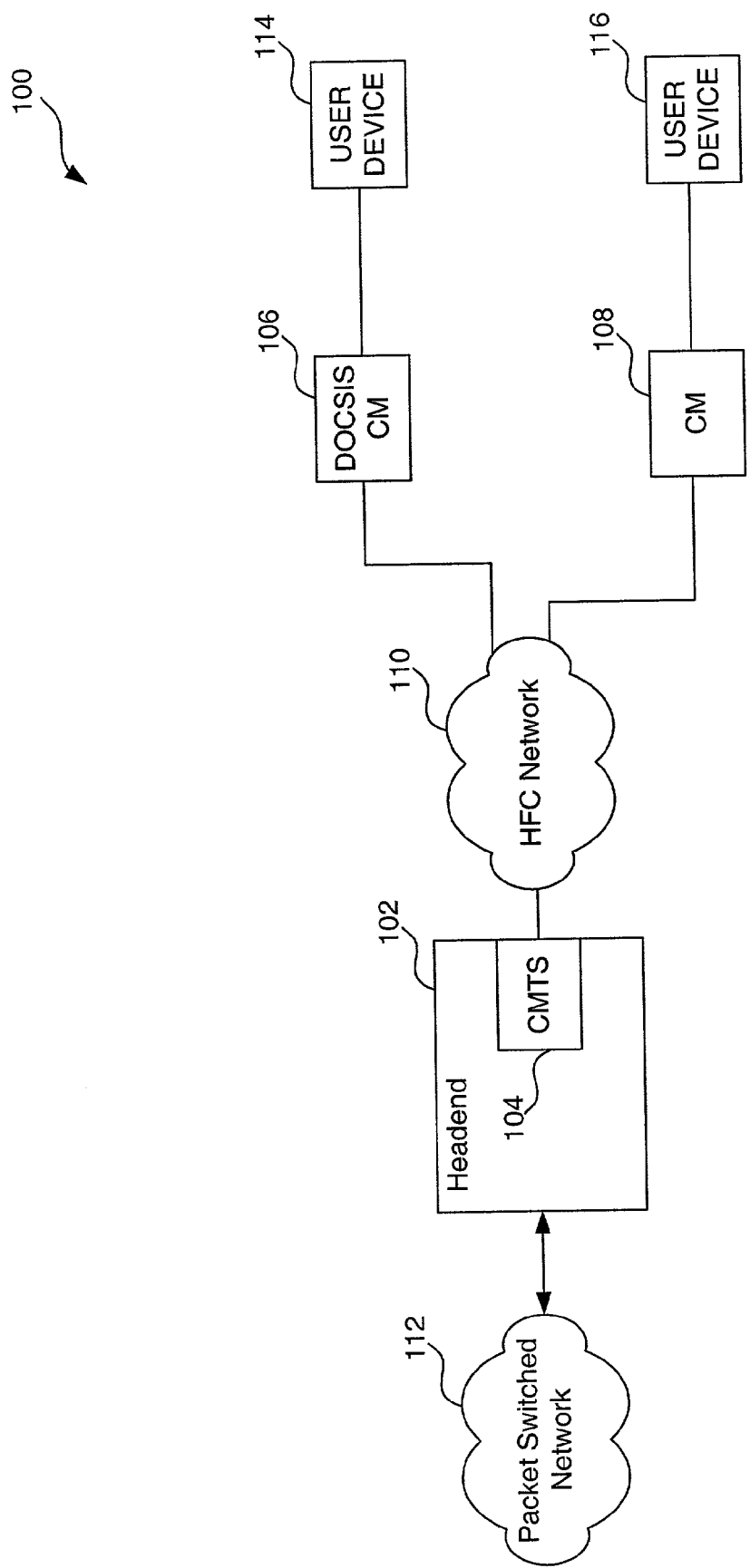
FIG. 1 is a high level block diagram of a cable modem system in accordance with embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Table of Contents

A. Cable Modem System in Accordance with Embodiments of the Present Invention
B. Example Cable Modem System Components in Accordance with Embodiments of the Present Invention
C. Packet PDU Compression in Accordance with Embodiments of the Present Invention
  1. Data Compression Dictionary
  2. Packet PDU Compression
  3. Packet PDU Expansion
D. Conclusion A. Cable Modem System in accordance with Embodiments of the Present Invention FIG. 1 is a high level block diagram of an example cable modem system 100 in accordance with embodiments of the present invention. The cable modem system 100 enables voice communications, video and data services based on a bi-directional transfer of Internet protocol (IP) traffic between a cable system headend 102 and a plurality of cable modems over a hybrid fiber-coaxial (HFC) cable network 110. In the example cable modem system 100, only two cable modems 106 and 108 are shown for clarity. In general, any number of cable modems may be included in the cable modem system of the present invention.

The cable headend 102 is comprised of at least one cable modem termination system (CMTS) 104. The CMTS 104 is the portion of the cable headend 102 that manages the upstream and downstream transfer of data between the cable headend 102 and the cable modems 106 and 108, which are located at the customer premises. The CMTS 104 broadcasts information downstream to the cable modems 106 and 108 as a continuous transmitted signal in accordance with a time division multiplexing (TDM) technique. Additionally, the CMTS 104 controls the upstream transmission of data from the cable modems 106 and 108 to itself by assigning to each cable modem 106 and 108 short grants of time within which to transfer data. In accordance with this time domain multiple access (TDMA) technique, each cable modem 106 and 108 may only send information upstream as short burst signals during a transmission opportunity allocated to it by the CMTS 104.

The CMTS 102 further serves as interface between the HFC network 110 and a packet-switched network 112, transferring IP packets received from the cable modems 106 and 108 to the packet-switched network 112 and transferring IP packets received from the packet-switched network 112 to the cable modems 106 and 108 when appropriate. In embodiments, the packet-switched network 112 comprises the Internet.

In addition to the CMTS 104, the cable headend 102 may also include one or more Internet routers to facilitate the connection between the CMTS 104 and the packet-switched network 112, as well as one or more servers for performing necessary network management tasks.

The HFC network 110 provides a point-to-multipoint topology for the high-speed, reliable, and secure transport of data between the cable headend 102 and the cable modems 106 and 108 at the customer premises. As will be appreciated by persons skilled in the relevant art(s), the HFC network 110 may comprise coaxial cable, fiberoptic cable, or a combination of coaxial cable and fiberoptic cable linked via one or more fiber nodes.

Each of the cable modems 106 and 108 operates as an interface between the HFC network 110 and at least one attached user device. In particular, the cable modems 106 and 108 perform the functions necessary to convert downstream signals received over the HFC network 110 into IP data packets for receipt by an attached user device. Additionally, the cable modems 106 and 108 perform the functions necessary to convert IP data packets received from the attached user device into upstream burst signals suitable for transfer over the HFC network 110. In the example cable modem system 100, each cable modem 106 and 108 is shown supporting only a single user device 114 and 116. In general, each cable modem 106 and 108 is capable of supporting a plurality of user devices for communication over the cable modem system 100. User devices may include personal computers, data terminal equipment, telephony devices, broadband media players, network-controlled appliances, or any other device capable of transmitting or receiving data over a packet-switched network.

In the example cable modem system 100, cable modem 106 represents a conventional DOCSIS-compliant cable modem. In other words, cable modem 106 transmits data packets to the CMTS 104 in formats that adhere to the protocols set forth in the DOCSIS specification. Cable modem 108 is likewise capable of transmitting data packets to the CMTS 104 in standard DOCSIS formats. However, in accordance with embodiments of the present invention, the cable modem 108 is also configured to transmit data packets to the CMTS 104 using proprietary protocols that extend beyond the DOCSIS specification. Nevertheless, cable modem 108 is fully interoperable with the DOCSIS-compliant cable modems, such as cable modem 106, and with DOCSIS-compliant CMTS equipment. The manner in which cable modem 108 operates to transfer data will be described in further detail herein.

Furthermore, in the example cable modem system 100, the CMTS 104 operates to receive and process data packets transmitted to it in accordance with the protocols set forth in the DOCSIS specification. However, in accordance with embodiments of the present invention, the CMTS 104 can also operate to receive and process data packets that are formatted using proprietary protocols that extend beyond those provided by the DOCSIS specification, such as data packets transmitted by the cable modem 108. The manner in which the CMTS 104 operates to receive and process data will also be described in further detail herein.

Figure 2:
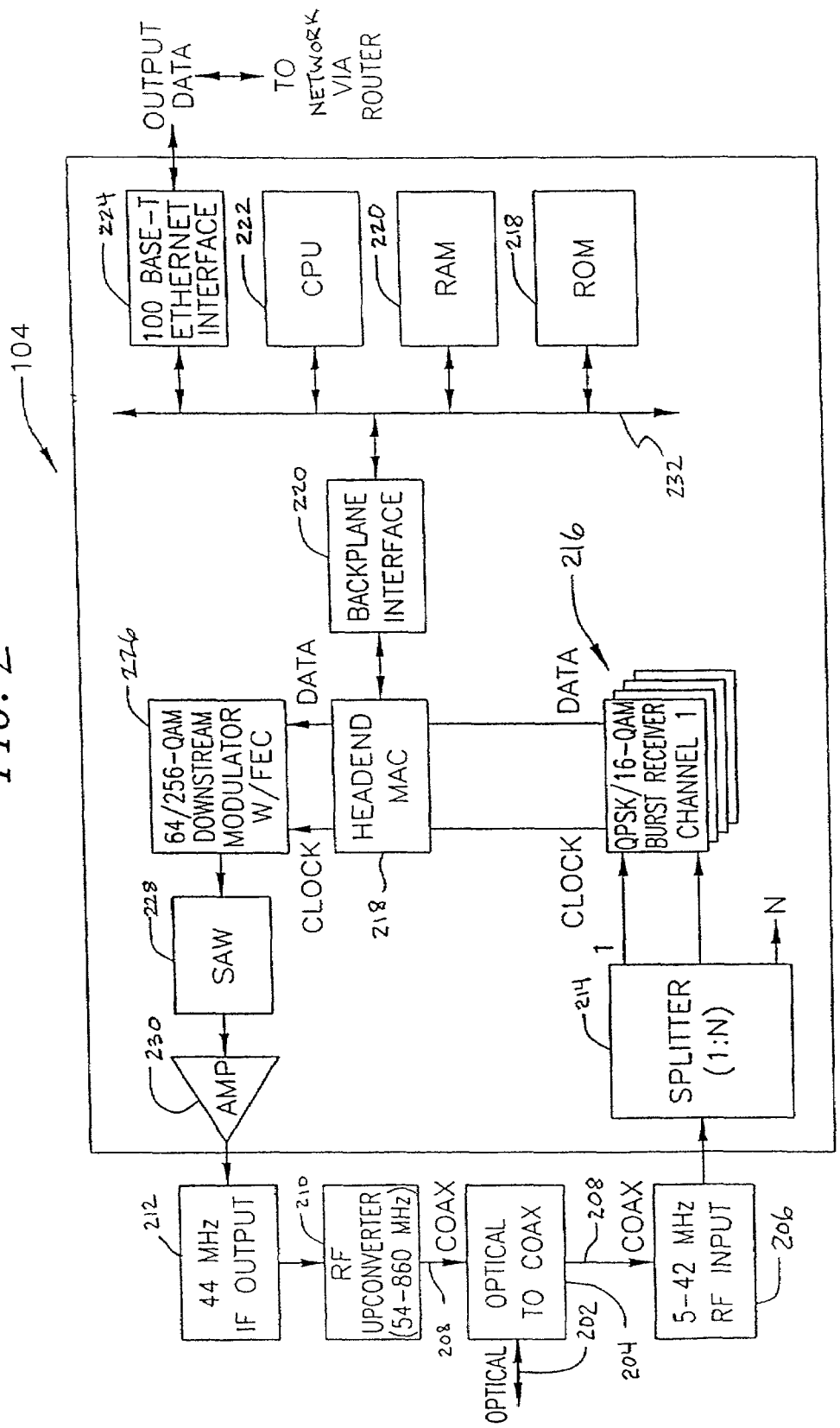
FIG. 2 is a schematic block diagram of a cable modem termination system (CMTS) in accordance with embodiments of the present invention.

B. Example Cable Modem System Components in Accordance with Embodiments of the Present Invention FIG. 2 depicts a schematic block diagram of an implementation of the CMTS 104 of cable modem system 100, which is presented by way of example, and is not intended to limit the present invention. The CMTS 104 is configured to receive and transmit signals to and from the HFC network 110, a portion of which is represented by the optical fiber 202 of FIG. 2. Accordingly, the CMTS 104 will be described in terms of a receive path and a transmit path.

The receive path begins with the receipt of upstream burst signals originating from one or more cable modems by the optical-to-coax stage 204 via the optical fiber 202. The optical-to-coax stage 204 routes the received burst signals to a radio frequency (RF) input 206 via coaxial cable 208. In embodiments, these upstream burst signals having spectral characteristics within the frequency range of roughly 5-42 MHz.

The received signals are provided by the RF input 206 to the splitter 214 of the CMTS 104, which separates the RF input signals into N separate channels. Each of the N separate channels is then provided to a separate burst receiver 216 which operates to demodulate the received signals on each channel in accordance with either a Quadrature Phase Shift Key (QPSK) or 16 Quadrature Amplitude Modulation (QAM) technique to recover the underlying information signals. Each burst receiver 216 also converts the underlying information signals from an analog form to digital form. This digital data is subsequently provided to the headend medium access control (MAC) 218.

The headend MAC 218 operates to process the digital data in accordance with the DOCSIS specification and, when appropriate, in accordance with proprietary protocols that extend beyond the DOCSIS specification, as will be described in further detail herein. The functions of the headend MAC 218 may be implemented in hardware or in software. In the example implementation of FIG. 2, the functions of the headend MAC 218 are implemented both in hardware and software. Software functions of the headend MAC 218 may be stored in either the random access memory (RAM) 220 or the read-only memory (ROM) 218 and executed by the CPU 222. The headend MAC is in electrical communication with these elements via a backplane interface 220 and a shared communications medium 232. In embodiments, the shared communications medium 232 may comprise a computer bus or a multiple access data network.

The headend MAC 218 is also in electrical communication with the Ethernet interface 224 via both the backplane interface 220 and the shared communications medium 232. When appropriate, Ethernet packets recovered by the headend MAC 218 are transferred to the Ethernet interface 224 for delivery to the packet-switched network 112 via a router.

The transmit path of the CMTS 104 begins with the generation of a digital broadcast signal by the headend MAC 218. The digital broadcast signal may include data originally received from the packet-switched network 112 via the Ethernet interface 224. The headend MAC 218 outputs the digital broadcast signal to the downstream modulator 226 which converts it into an analog form and modulates it onto a carrier signal in accordance with either a 64-QAM or 256-QAM technique.

The modulated carrier signal output by the downstream modulator 256 is input to a surface acoustic wave (SAW) filter 228 which passes only spectral components of the signal that are within a desired bandwidth. The filtered signal is then output to an amplifier 230 which amplifies it and outputs it to the intermediate frequency (IF) output 212. The IF output 212 routes the signal to the radio frequency (RF) upconverter 210, which upconverts the signal. In embodiments, the upconverted signal has spectral characteristics within the frequency range of approximately 54-860 MHz. The upconverted signal is then output to the optical-to-coax stage 204 over the coaxial cable 208. The optical-to-coax stage 204 broadcasts the signal via the optical fiber 202 of the HFC network 110.

Figure 3:
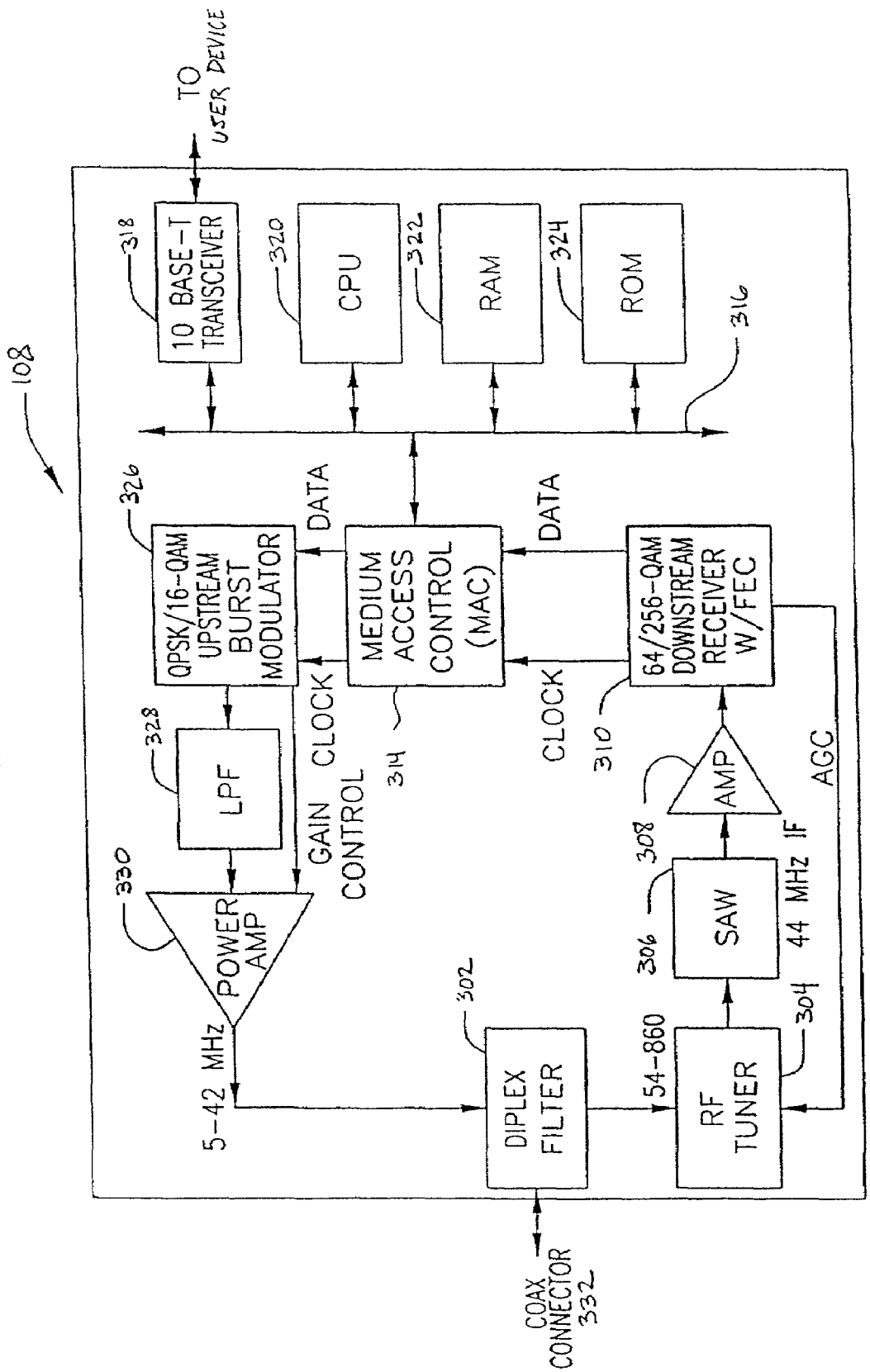
FIG. 3 is a schematic block diagram of a cable modem in accordance with embodiments of the present invention.

FIG. 3 depicts a schematic block diagram of an implementation of the cable modem 108 of cable modem system 100, which is presented by way of example, and is not intended to limit the present invention. The cable modem 108 is configured to receive and transmit signals to and from the HFC network 110 via the coaxial connector 332 of FIG. 3. Accordingly, the cable modem 108 will be described in terms of a receive path and a transmit path.

The receive path begins with the receipt of a downstream signal originating from the CMTS 104 by the diplex filter 302. The diplex filter 302 operates to isolate the downstream signal and route it to the RF tuner 304. In embodiments, the downstream signal has spectral characteristics in the frequency range of roughly 54-860 MHz. The RF tuner 304 downconverts the signal and outputs it to the SAW filter 306, which passes only spectral components of the downconverted signal that are within a desired bandwidth. The filtered signal is output to an amplifier 308 which amplifies it and passes it to a downstream receiver 310. Automatic gain controls are provided from the downstream receiver 310 to the RF tuner 304.

The downstream receiver 310 demodulates the amplified signal in accordance with either a 64-QAM or 256 QAM technique to recover the underlying information signal. The downstream receiver 310 also converts the underlying information signal from an analog form to digital form. This digital data is subsequently provided to the medium access control (MAC) 314.

The MAC 314 processes the digital data, which may include, for example, Ethernet packets for transfer to an attached user device. The functions of the MAC 314 may be implemented in hardware or in software. In the example implementation of FIG. 3, the functions of the MAC 314 are implemented in both hardware and software. Software functions of the MAC 314 may be stored in either the RAM 322 or the ROM 324 and executed by the CPU 320. The MAC 314 is in electrical communication with these elements via a shared communications medium 316. In embodiments, the shared communications medium may comprise a computer bus or a multiple access data network.

The MAC 314 is also in electrical communication with the Ethernet interface 318 via the shared communications medium 316. When appropriate, Ethernet packets recovered by the MAC 314 are transferred to the Ethernet interface 318 for transfer to an attached user device.

The transmit path of the cable modem 108 begins with the construction of a data packet by the MAC 314. The data packet may include data originally received from an attached user device via the Ethernet interface 318. In accordance with embodiments of the present invention, the MAC 314 may format the data packet in compliance with the protocols set forth in the DOCSIS specification or, when appropriate, may format the data packet in compliance with a proprietary protocol that extends beyond those set forth in the DOCSIS specification, as will be described in further detail herein. The MAC 314 outputs the data packet to an upstream burst modulator 326 which converts it into analog form and modulates it onto a carrier signal in accordance with either a QPSK or 16-QAM technique.

The upstream burst modulator 326 outputs the modulated carrier signal to a low pass filter 328 which passes signals with spectral characteristics in a desired bandwidth. In embodiments, the desired bandwidth is within the frequency range of approximately 5-42 MHz. The filtered signals are then introduced to a power amplifier 330 which amplifies the signal and provides it to the diplex filter 302. The gain in the power amplifier 330 is regulated by the burst modulator 326. The diplex filter 302 isolates the amplified signal and transmits it upstream over the HFC network 110 during a scheduled burst opportunity.

C. Packet PDU Compression in Accordance with Embodiments of the Present Invention 1. Data Compression Dictionary Traditional modem data compression techniques are not useful within a DOCSIS network topology. The most popular algorithm (LZW) requires a data compression dictionary to be dynamically constructed at run-time. This requirement forces both ends of the communications pipe to have roughly equivalent CPU power. In a DOCSIS system, the CMTS CPU would have to be 1000 to 2000 times faster than the average cable modem to keep up with this dictionary processing. Thus, in accordance with the present invention, the cable modem 108 and the CMTS 104 are each provided with a data compression dictionary. The data compression dictionary will now be described with respect to FIGS. 4 and 5.

An exemplary data compression dictionary is illustrated in FIG. 4. In an embodiment, the data compression dictionary is a predefined, fixed lookup table. The lookup table is comprised of a payload data string section 405 and a token section 410. The payload data string section 405 is used to list ASCII character strings that are frequently found in the PDU payload portion of a DOCSIS data packet. PDU payload data is the essential data that is being carried within a packet or other transmission unit. In most cases, the payload does not include the "overhead" data required to get the packet to its destination. However, to a communications layer that needs some of the overhead data to do its job, the payload is sometimes considered to include the part of the overhead data that this layer handles. However, in more general usage, the payload is the bits that get delivered to the end user at the destination. For example, where a user is surfing the Internet or World Wide Web, many identical ASCII strings are transmitted. These ASCII strings include among others, "http://www.", "POP", "SMTP", "GET", and "POP". In embodiments of the present invention, each string in the payload data string section 405 is associated with a binary token stored in token section 410. During compression, the binary tokens are substituted for the ASCII strings. This results in fewer bytes needing to be transmitted. The process of creating the data compression dictionary will now be explained with reference to FIG. 5.

Figure 5:
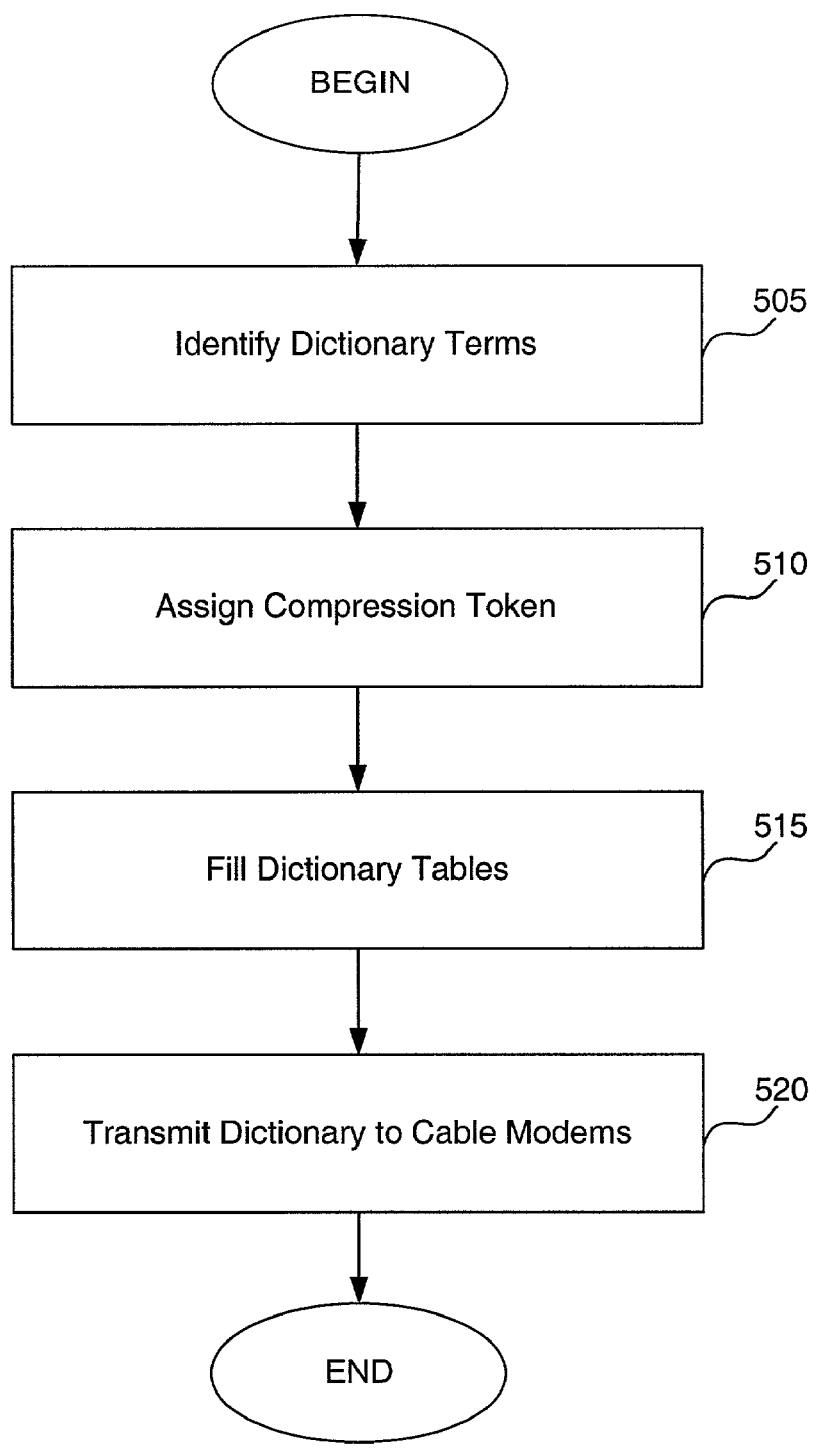
FIG. 5 is a flowchart of a method for generating a data compression dictionary in accordance with embodiments of the present invention.

FIG. 5 is a flowchart of a method for generating a data compression dictionary in accordance with embodiments of the present invention.

At step 505, the ASCII strings to be entered into the data compression dictionary are identified. In an embodiment, the CMTS analyzes the data strings being exchanged between it and the cable modems in the HFC network 110. The CMTS then selects the most frequently occurring data strings for entry into the data compression dictionary. In this way, the data compression dictionary is tuned for the particular HFC network 110 in which the CMTS and cable modems are located.

At step 510, the CMTS assigns a token, for example, a binary token, to represent the data strings identified in step 505. In an embodiment, the most frequently occurring data string is assigned the smallest binary token. The next most frequently occurring data string is assigned the next smallest binary token and so on. In this way, the fewest number of bytes are substituted for the most frequently occurring data strings.

At step 515, the CMTS enters each identified data string from step 505 and its assigned binary token from step 510 into a lookup table. The maximum width and length of the lookup table is determined by the amount of memory space allocated to the data compression dictionary.

At step, 520, the CMTS transmits the data compression dictionary to each cable modem with the HFC network 110. In an embodiment, the dictionary is transmitted to each cable modem during an initialization process (i.e., when the modem is connected to the network). In alternative embodiments, the cable modem could be instructed to halt compression in real time so that the CMTS can transmit an updated data compression dictionary.

In accordance with the present invention, the cable modem 108 and the CMTS 104 are adapted to send and receive compressed data. For example, in accordance with embodiments of the present invention, prior to transmission over the HFC network 110, the cable modem 108 is adapted to compress PDU payload data using a data compression dictionary and the CMTS 104 is adapted to reconstruct the compressed PDU payload data upon receiving it. Alternatively, the CMTS 104 could be adapted to compress the PDU payload data using a data compression dictionary and the cable modem 108 would be adapted to reconstruct it. A method for PDU packet compression and expansion will now be explained with respect to FIGS. 6 and 7.

2. Packet PDU Compression

Figure 6:
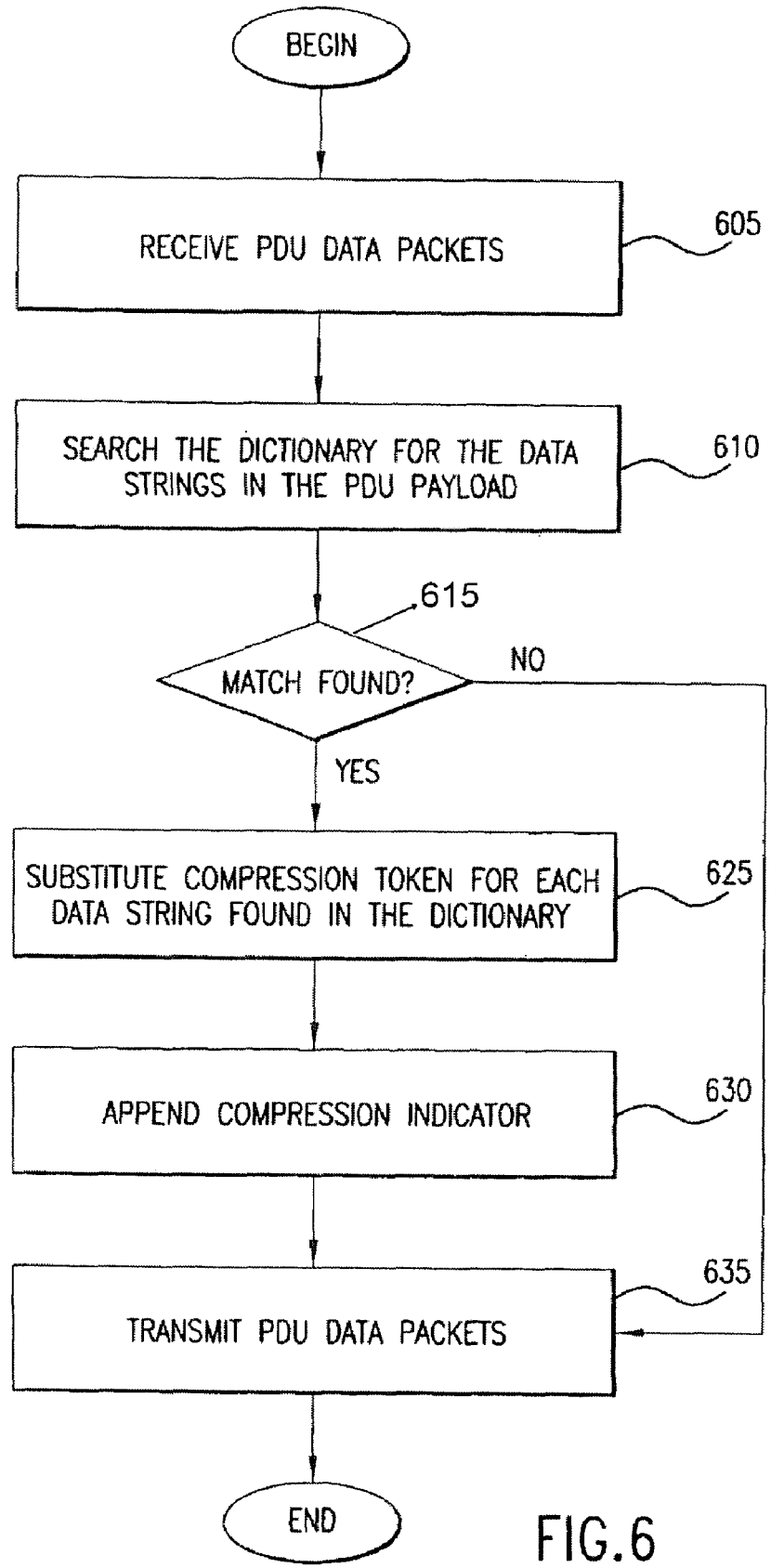
FIG. 6 is a flowchart of a method for compressing packet PDU data using a data compression dictionary in accordance with embodiments of the present invention.

FIG. 6 is useful for explaining a manner in which packets are compressed by cable modem 108 in accordance with embodiments of the present invention. The invention, however, is not limited to the description provided herein with respect to flowchart 600. Rather, it will be apparent to persons skilled in the relevant art(s) after reading the teachings provided herein that other functional flows are within the scope and spirit of the present invention. The flowchart 600 will be described with continued reference to the example cable modem system 100 of FIG. 1.

At step 605, the cable modem 108 receives one or more data packets from the user device 116. The data packets include a payload comprising anywhere from 1 to N bytes, depending on the type of data being sent. In accordance with the present invention, the data packets can be generated by an application program running on the user device 116 described above in reference to FIG. 1. For example, an application program running on the user device 116 may generate voice or data information for transmission over the HFC network 110. This voice or data information comprises the payload portion of the data packets.

At step 610, the cable modem 108 determines if the payload of the data packets can be compressed in accordance with the present invention. In making this determination, the cable modem 108 searches each payload to identify any data strings contained within the payload that are listed in the data compression dictionary.

In step 615, if any data strings contained within the payload are found listed in the lookup table of the data compression dictionary, then control is passed to step 625 so that the data strings can be compressed. In this way, the cable modem 108 will only compress a payload having data strings listed in the lookup table of the data compression dictionary. If no data strings are listed, control passes immediately to step 635 and the full payload (i.e. uncompressed data strings) of the data packet is transmitted by the cable modem 108.

At step 625, the cable modem 108 will replace the data strings within each payload with the binary tokens corresponding to the data strings listed in the data compression dictionary.

At step 630, the cable modem 108 will append a compression indicator to each token within the payload portion of the PDU data packet. This indicator serves as a signal to the CMTS that the payload portion of the PDU data packet has been compressed and that the data compression dictionary will need to be referenced. The compression indicator contains a value indicating the length (number of bytes) of the token. By communicating the length of the token, the compression indicator also signals the CMTS where the compressed data string begins and ends.

At step 635, the cable modem 108 transmits those data packets having a full payload and those data packets having compressed payloads to the CMTS 104 over the HFC network 110.

In an embodiment, prior to step 605, the cable modem 108 would have been turned on and a handshaking routine initiated with the CMTS 104 via the HFC network 110. During this initialization process, the cable modem 108 would be provided with the data compression dictionary. In this way, the cable modem 108 is provided with the most current version of the data compression dictionary prior to sending any packets.

3. Packet PDU Expansion

Figure 7:
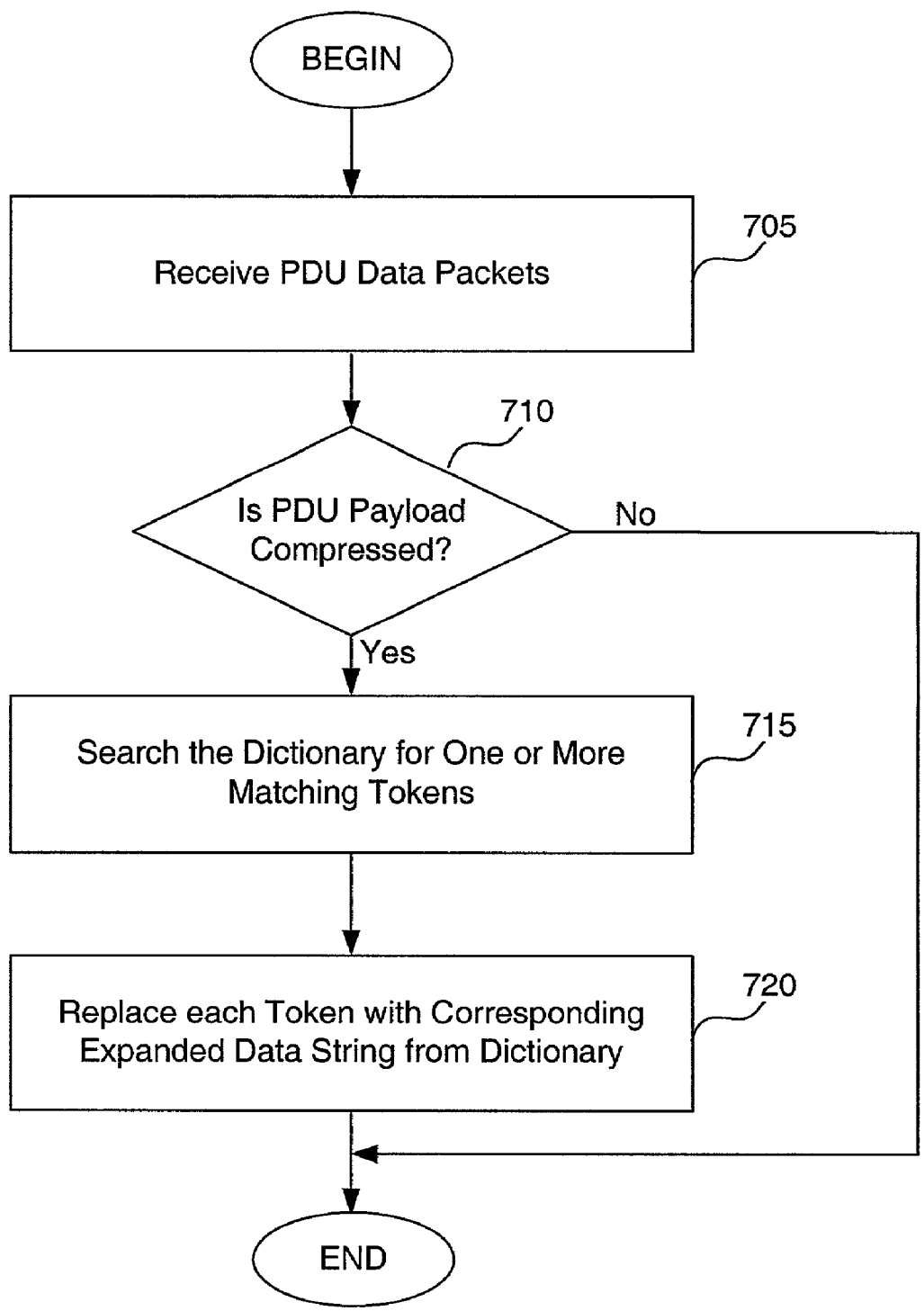
FIG. 7 is a flowchart of a method for expanding packet PDU data using a data compression dictionary in accordance with embodiments of the present invention.

FIG. 7 is a flowchart of a method for expanding data packets using a data compression dictionary in accordance with embodiments of the present invention.

At step 705, the CMTS 104 receives a plurality of data packets.

At step 710, the CMTS examines the data packets to determine if any of the payloads have been compressed. If a compression indicator is found, then the CMTS 104 knows that the payload has been compressed. If no compression indicator is found, then the payload is not suppressed and the payload is processed according to standard protocols.

Once the CMTS 104 has identified the payloads that have been compressed, then at a step 715, the CMTS 104 searches the lookup table of its data compression dictionary to identify the binary tokens matching the one or more tokens contained in the payloads. The length of the compressed data (i.e., binary tokens) is determined by the value stored in the compression indicators.

At step 720, the CMTS 104 expands each payload. To do so, the CMTS 104 will overwrite the binary tokens within each payload with the expanded data string corresponding to the binary token as listed in the lookup table of the data compression dictionary. In expanding each payload, CMTS 104 produces a PDU data packet matching that previously presented in step 605 of FIG. 6.

D. Conclusion

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method for generating a data compression dictionary and utilizing it to enhance communication efficiency in a DOCSIS compliant network, comprising the steps of:
   i. identifying a plurality of frequently occurring data strings transmitted by a plurality of cable modems in the DOCSIS network;
   ii. assigning a token to represent each one of the plurality of frequently occurring data strings;
   iii. entering each one of the plurality of frequently occurring data strings and each token assigned to represent each one of the plurality of frequently occurring data strings into a lookup table to produce a data compression dictionary; and
   iv. transmitting the data compression dictionary to the plurality of cable modems in the DOCSIS network during initialization of each of the plurality of cable modems.

2. The method of claim 1, further comprising repeating steps i.-iv. for each of a plurality of DOCSIS networks, thereby generating a plurality of data compression dictionaries, each of which is individually tuned for a corresponding one of the plurality of DOCSIS networks.

3. A method for transmitting compressed data packets in a DOCSIS network, comprising the steps of:
   i. receiving a plurality of data packets for transmission, wherein each of said data packets has a payload portion comprised of one or more data strings;
   ii. identifying which of said data packets has a payload portion that can be compressed;
   iii. for each of said data packets identified in said step (b), replacing each of said one or more data strings contained in said payload portion with a token from a data compression dictionary assigned to represent said one or more data strings, wherein said data compression dictionary is tuned to data transmitted by a plurality of cable modems on the DOCSIS network;
   iv. appending a compression indicator to each of said tokens within each of said data packets; and
   v. transmitting said data packets within a DOCSIS service identifier; and
   vi. transmitting said data dictionary to each cable modem on the DOCSIS network when each said cable modem is initialized.

4. The method of claim 3 wherein the token is a binary string.

5. The method of claim 4 wherein the compression indicator indicates the length of the binary string.

6. The method of claim 3 wherein said data compression dictionary is pre-defined and fixed.

7. A method for expanding a PDU data string transmitted over a DOCSIS network, comprising the steps of:
   i. receiving a plurality of data packets transmitted within a DOCSIS service identifier, wherein each of said data packets has a payload portion;
   ii. identifying each of said plurality of data packets having a compression indicator appended to one or more tokens within said payload portion; and
   iii. for each of said data packets identified in said step (b), replacing each of said one or more tokens contained within said payload portion with a data string assigned to represent said one or more tokens found in a data compression dictionary, wherein said data compression dictionary is tuned to data transmitted by a plurality of cable modems on the DOCSIS network and downloaded to each cable modem when it is initialized.

8. The method of claim 7, wherein the token is a binary string.

9. The method of claim 8, wherein the compression indicator identifies the length of the binary string.

10. The method of claim 1, further comprising:
    v. updating the data compression dictionary; and
    vi. transmitting the updated data compression dictionary to each modem of the plurality of cable modems in the DOCSIS network.

11. The method of claim 1, further comprising:
    v. transmitting the data compression dictionary to a new cable modem responsive to the new cable modem being connected to the DOCSIS network.

* * * * *